(12) United States Patent
Miyagi et al.

(10) Patent No.: US 11,056,378 B2
(45) Date of Patent: Jul. 6, 2021

(54) WORKPIECE HOLDING METHOD AND WORKPIECE PROCESSING METHOD

(71) Applicant: DISCO CORPORATION, Tokyo (JP)

(72) Inventors: Yusuke Miyagi, Tokyo (JP); Paul Vincent Atendido, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/719,143

(22) Filed: Dec. 18, 2019

(65) Prior Publication Data

US 2020/0219751 A1 Jul. 9, 2020

(30) Foreign Application Priority Data

Jan. 7, 2019 (JP) .............................. JP2019-000559

(51) Int. Cl.
*H01L 21/683* (2006.01)
*H01L 21/304* (2006.01)
*H01L 21/67* (2006.01)

(52) U.S. Cl.
CPC ........ *H01L 21/6838* (2013.01); *H01L 21/304* (2013.01); *H01L 21/6715* (2013.01)

(58) Field of Classification Search
CPC ............. H01L 21/67288; H01L 21/683; H01L 21/6838; H01L 21/304; H01L 21/6715; Y10T 279/11; G03F 7/707; B23B 31/307; B25B 11/005

See application file for complete search history.

(56) References Cited

U.S. PATENT DOCUMENTS

| 5,707,051 A * | 1/1998 | Tsuji ..................... B25B 11/005 269/21 |
| 6,446,948 B1* | 9/2002 | Allen .................... B25B 11/005 118/500 |
| 6,612,590 B2* | 9/2003 | Coomer .............. H01L 21/6838 279/158 |
| 7,078,262 B2* | 7/2006 | Yamamoto ........ H01L 21/67132 257/E21.122 |
| 7,214,548 B2* | 5/2007 | Fayaz ............... H01L 21/67288 438/4 |

(Continued)

FOREIGN PATENT DOCUMENTS

JP 2018117041 A 7/2018

*Primary Examiner* — Gregory W Adams
(74) *Attorney, Agent, or Firm* — Greer, Burns & Crain, Ltd.

(57) ABSTRACT

A workpiece holding method for a workpiece having a bowl-shaped warp includes a mounting step of mounting the workpiece on a holding unit having a holding surface, a suction hole opening to the holding surface, and a suction passage for making selective communication between the suction hole and a vacuum source for producing a suction force, the workpiece being mounted on the holding surface of the holding unit, a liquid supplying step of supplying a liquid to the workpiece held on the holding surface so that the liquid flows into a gap defined between the holding surface and the workpiece to fill the gap, and a suction step of bringing the suction hole into communication with the vacuum source to suck the liquid and the workpiece and thereby hold the workpiece through the liquid on the holding surface under suction, after performing the liquid supplying step.

8 Claims, 6 Drawing Sheets

(56) References Cited

U.S. PATENT DOCUMENTS

| | | | | |
|---|---|---|---|---|
| 8,089,615 B2* | 1/2012 | Mizutani | ............ | H01L 21/68735 |
| | | | | 355/73 |
| 8,138,456 B2* | 3/2012 | Fukuda | ............. | H01L 21/67748 |
| | | | | 219/497 |
| 8,336,188 B2* | 12/2012 | Monteen | ............. | H01L 21/6838 |
| | | | | 29/559 |
| 8,706,289 B2* | 4/2014 | Monteen | ............. | H01L 21/6838 |
| | | | | 700/213 |
| 8,748,780 B2* | 6/2014 | Moro | ...................... | C23C 16/46 |
| | | | | 219/390 |
| 9,690,206 B2* | 6/2017 | Shibuta | ................... | G03F 7/707 |
| 2015/0214085 A1* | 7/2015 | Jin | .................... | H01L 21/67144 |
| | | | | 414/806 |
| 2016/0240414 A1* | 8/2016 | Conradi | ............. | H01L 21/6838 |
| 2017/0053822 A1* | 2/2017 | Ben Natan | .......... | H01L 21/6838 |

* cited by examiner

WORKPIECE HOLDING METHOD AND WORKPIECE PROCESSING METHOD

BACKGROUND OF THE INVENTION

Field of the Invention

The present invention relates to a workpiece holding method for holding a workpiece having a bowl-shaped warp and a workpiece processing method for processing the workpiece held by using the workpiece holding method.

Description of the Related Art

In a case where a workpiece to be processed has a bowl-shaped warp, the workpiece cannot be well held on a flat holding surface of a holding table under suction by simply applying a suction force to the holding surface. Accordingly, it is difficult to process the workpiece held on the holding surface, e.g., to perform cutting of the workpiece. To cope with this problem, there has been proposed a technique of pressing the workpiece mounted on the holding table by using a plate to thereby flatten the workpiece and then holding the workpiece on the holding table under suction (see JP 2018-117041A, for example).

SUMMARY OF THE INVENTION

In a processing apparatus described in JP 2018-117041A, there is a possibility that foreign matter may adhere to a subject surface of the workpiece in pressing the subject surface by using the plate. Accordingly, the adoption of the above technique is difficult, depending on the kind of the workpiece.

It is therefore an object of the present invention to provide a workpiece holding method which can suitably hold a workpiece having a bowl-shaped warp on a holding table under suction without causing the adherence of foreign matter to the workpiece in pressing the workpiece.

It is another object of the present invention to provide a workpiece processing method which can suitably process the workpiece held by using the workpiece holding method mentioned above.

In accordance with an aspect of the present invention, there is provided a workpiece holding method for holding a workpiece having a bowl-shaped warp, including: a mounting step of mounting the workpiece on a holding unit having a holding surface for holding the workpiece, a suction hole opening to the holding surface, and a suction passage for making selective communication between the suction hole and suction means for producing a suction force, the workpiece being mounted on the holding surface of the holding unit; a liquid supplying step of supplying a liquid to the workpiece held on the holding surface so that the liquid flows into a gap defined between the holding surface and the workpiece to fill the gap; and a suction step of bringing the suction hole into communication with the suction means to suck the liquid and the workpiece and thereby hold the workpiece through the liquid on the holding surface under suction, after performing the liquid supplying step.

Preferably, the mounting step includes holding the workpiece by using a transfer mechanism and next mounting the workpiece on the holding surface by using the transfer mechanism, and the liquid supplying step includes supplying water as the liquid from the transfer mechanism to the workpiece held on the holding surface.

In accordance with another aspect of the present invention, there is provided a workpiece processing method for processing a workpiece having a bowl-shaped warp, including: a mounting step of mounting the workpiece on a holding unit having a holding surface for holding the workpiece, a suction hole opening to the holding surface, and a suction passage for making selective communication between the suction hole and suction means for producing a suction force, the workpiece being mounted on the holding surface of the holding unit; a liquid supplying step of supplying a liquid to the workpiece held on the holding surface so that the liquid flows into a gap defined between the holding surface and the workpiece to fill the gap; a suction step of bringing the suction hole into communication with the suction means to suck the liquid and the workpiece and thereby hold the workpiece through the liquid on the holding surface under suction, after performing the liquid supplying step; a processing step of processing the workpiece held on the holding surface after performing the suction step; and an unloading step of holding the workpiece by using a transfer mechanism after performing the processing step, and then unloading the workpiece from the holding surface by using the transfer mechanism.

Preferably, the workpiece includes a semiconductor wafer, and the processing step includes annularly cutting the semiconductor wafer along a peripheral edge thereof by using a cutting blade.

According to the workpiece holding method of the present invention, a leak of a suction force produced by the suction means can be prevented on the holding surface. Further, the workpiece having a bowl-shaped warp can be held under suction without pressing the workpiece.

In the mounting step of the workpiece holding method, the workpiece is preferably held by the transfer mechanism and then mounted on the holding surface by using the transfer mechanism. Furthermore, in the liquid supplying step of the workpiece holding method, water is preferably supplied as the liquid from the transfer mechanism to the workpiece held on the holding surface. Accordingly, the mounting step and the liquid supplying step can be smoothly performed.

The workpiece processing method for processing the workpiece held by using the workpiece holding method according to the present invention includes the processing step of processing the workpiece after performing the suction step and the unloading step of holding the workpiece by using the transfer mechanism after performing the processing step, and then unloading the workpiece from the holding surface by using the transfer mechanism. Accordingly, the workpiece can be smoothly unloaded from the holding surface after suitably processing the workpiece.

In the workpiece processing method, the workpiece is preferably a semiconductor wafer, and the cutting blade is preferably used to annularly cut the semiconductor wafer along the peripheral edge. Accordingly, when the peripheral edge of the semiconductor wafer has a chamfered portion, this chamfered portion can be suitably cut out by the cutting blade.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
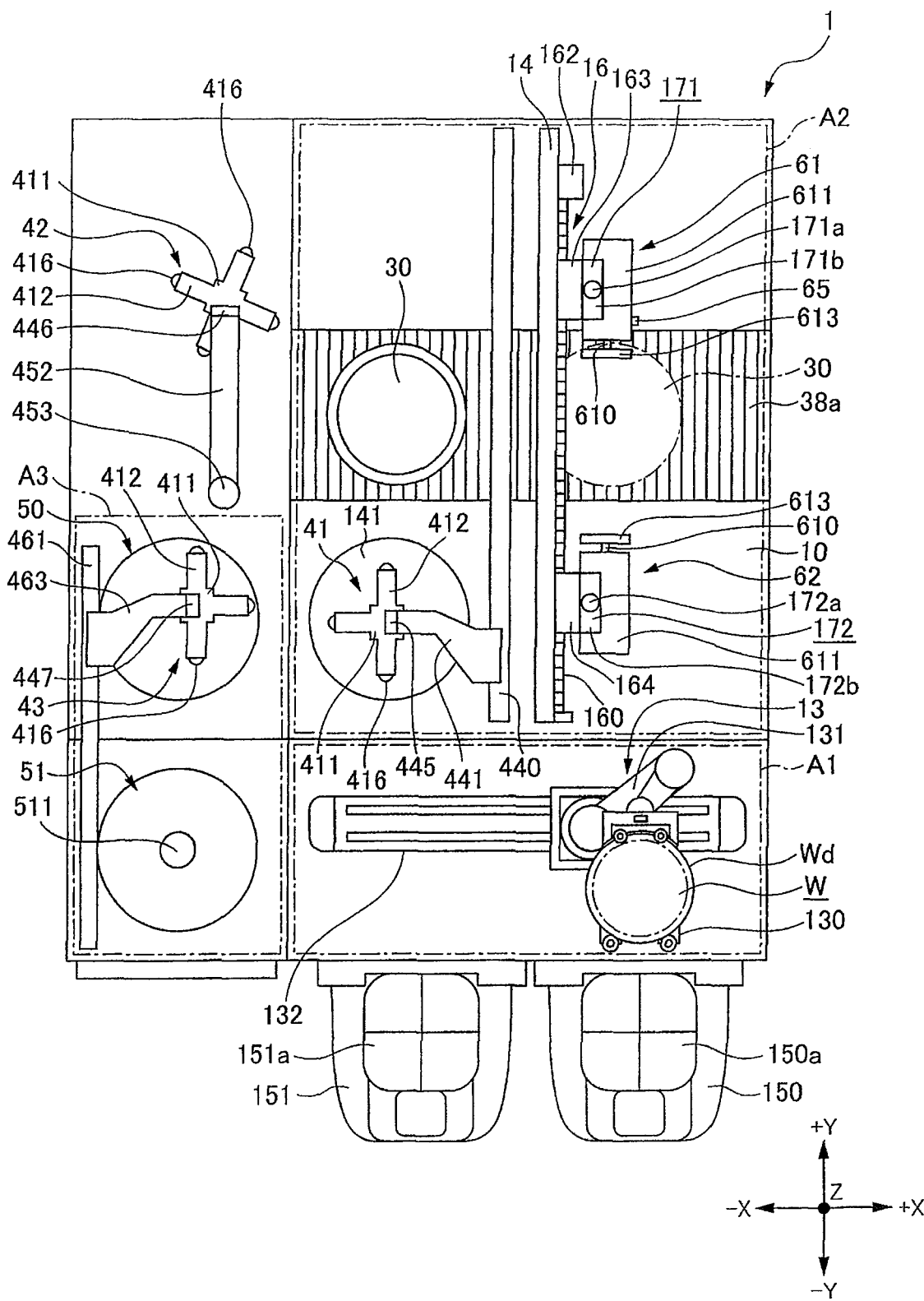
FIG. 1 is a schematic plan view of a processing apparatus.

Referring to FIG. 1, a processing apparatus 1 is depicted in plan. The processing apparatus 1 is a full automatic type cutting apparatus for cutting a disk-shaped workpiece W held on a holding unit 30 by using a first cutting unit 61 or a second cutting unit 62. This cutting apparatus is so configured as to fully automatically perform a series of operations including loading of the workpiece W to the holding unit 30 before processing, cutting of the workpiece W held on the holding unit 30, unloading of the workpiece W from the holding unit 30 after processing, and cleaning of the workpiece W after processing. The processing apparatus 1 is not limited to such a cutting apparatus, but may be any other processing apparatuses such as a laser processing apparatus for performing laser processing to the workpiece W by applying a laser beam and a grinding apparatus for grinding the workpiece W. In the following description, the X direction includes the +X direction depicted by an arrow +X in the drawings and the −X direction depicted by an arrow −X in the drawings. Similarly, the Y direction includes the +Y direction depicted by an arrow +Y in the drawings and the −Y direction depicted by an arrow −Y in the drawings. Further, the Z direction includes the +Z direction depicted by an arrow +Z in the drawings and the −Z direction depicted by an arrow −Z in the drawings. The X direction and the Y direction are perpendicular to each other to define a horizontal plane, and the Z direction is perpendicular to this horizontal plane.

The processing apparatus 1 includes a base 10 having a shape like a rectangular prism. The upper surface of the base 10 in its front portion (in the −Y direction) is set as a loading area A1, and the upper surface of the base 10 in its rear portion (in the +Y direction) is set as a processing area A2. Further, a cleaning area A3 is set on the upper surface of the base 10 in an area adjacent to the loading area A1 and the processing area A2.

A first cassette mounting portion 150 and a second cassette mounting portion 151 are provided on the front side surface of the base 10 so as to project frontward from the loading area A1. The first cassette mounting portion 150 is a portion for mounting a first cassette 150a thereon, in which a plurality of workpieces W are previously stored in the first cassette 150a before processing. The second cassette mounting portion 151 is a portion for mounting a second cassette 151a thereon, in which a plurality of workpieces W are stored into the second cassette 151a after processing. The first cassette mounting portion 150 functions as a loading port for loading the workpieces W from another apparatus to the processing apparatus 1, and the second cassette mounting portion 151 functions as an unloading port for unloading the workpieces W from the processing apparatus 1 to another apparatus (e.g., grinding apparatus).

A robot 13 is provided in the vicinity of the first cassette 150a and the second cassette 151a. The robot 13 functions to take each workpiece W out of the first cassette 150a before processing and store each workpiece W into the second cassette 151a after processing. The robot 13 includes a hand portion 130 for holding each workpiece W, an articulated bendable arm portion 131 connected to the hand portion 130, and moving means 132 for linearly moving the hand portion 130 and the arm portion 131 in the X direction, in which the moving means 132 includes a ball screw mechanism.

A temporary setting table 141 is provided in the processing area A2 in a movable range of the robot 13. The temporary setting table 141 functions to temporarily set the workpiece W transferred by the robot 13 before processing. The temporary setting table 141 is provided with centering means (not depicted) for centering the workpiece W temporarily set on the temporary setting table 141. For example, the centering means is configured by a plurality of pins arranged so as to form a circle, in which these plural pins are adapted to be radially moved toward the center of the circle. Accordingly, the workpiece W temporarily set inside the plural pins can be centered by radially moving the plural pins. As a result, the position of the center of the workpiece W can be grasped.

The holding unit 30 for holding the workpiece W is provided on the rear side of the temporary setting table 141 (in the +Y direction). The holding unit 30 is movable back and forth in the X direction between a standby position (depicted by a solid line in FIG. 1) where the workpiece W is loaded to the holding unit 30 and a cutting position (depicted by a phantom line in FIG. 1) where the workpiece W is cut. The upper surface of the base 10 is formed with a rectangular opening (not depicted) extending in the X direction along the path of movement of the holding unit 30. This opening is closed by a bellows cover 38a that can be expanded and contracted. A support cover 38b (see FIG. 2) for supporting the holding unit 30 is connected to the bellows cover 38a. A ball screw type moving mechanism (not depicted) for moving the holding unit 30 in the X direction back and forth is provided below the support cover 38b and the bellows cover 38a.

Figure 2:
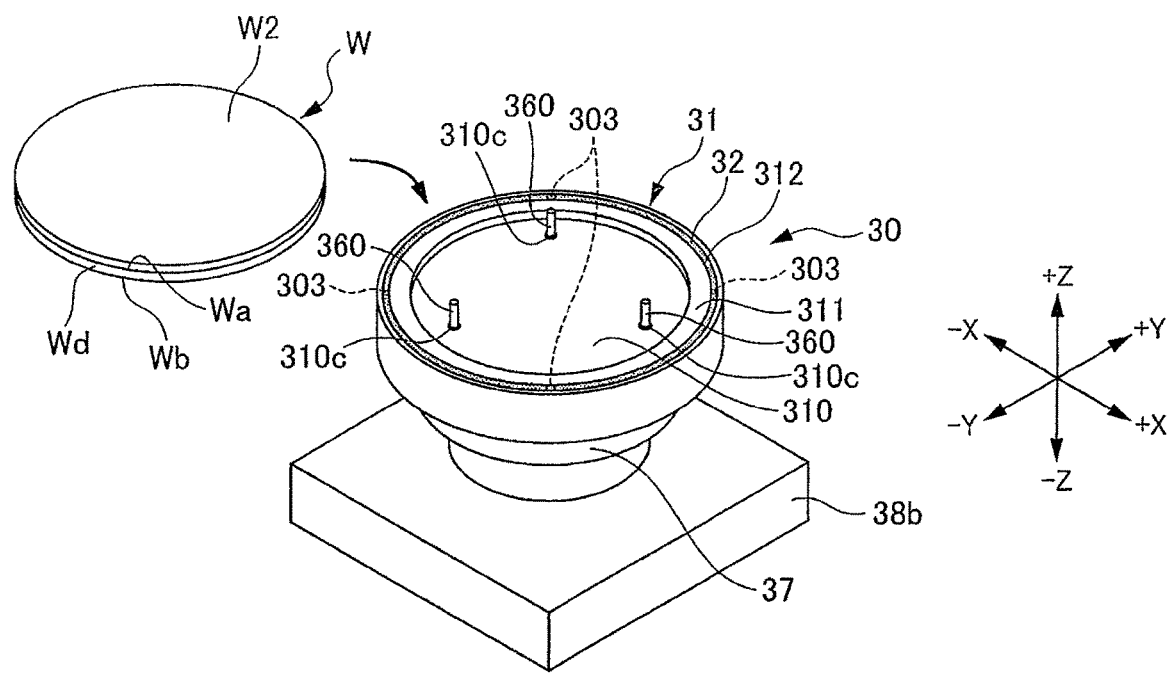
FIG. 2 is a perspective view of a holding unit and a workpiece.
Figure 3:
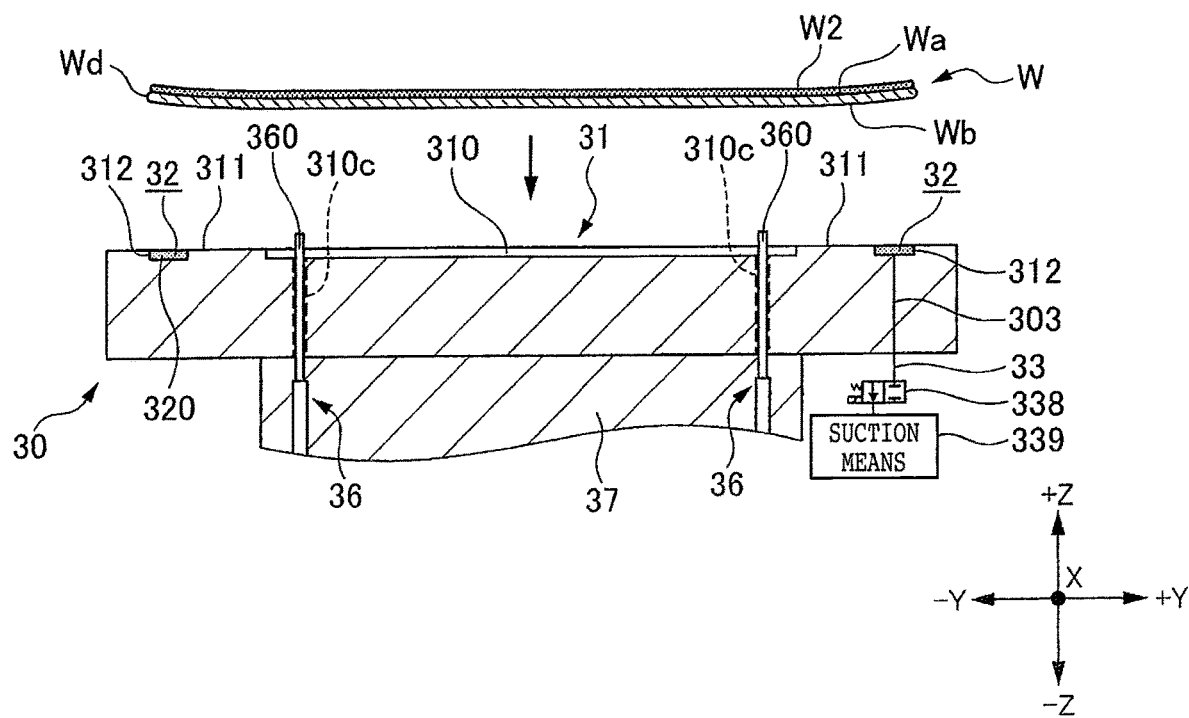
FIG. 3 is a sectional view of the holding unit and the workpiece depicted in FIG. 2.

As depicted in FIGS. 2 and 3, the holding unit 30 essentially includes a holding surface 31 for holding the workpiece W, suction holes 320 (not depicted in FIG. 2) opening to the holding surface 31, and a suction passage 33 for making selective communication between the suction holes 320 and suction means 339 depicted in FIG. 3. The workpiece W has a front side Wa, a back side Wb, and peripheral edge Wd connecting the front side Wa and the back side Wb. Further, a mold layer W2 is formed on the front side Wa.

As depicted in FIG. 2, the holding unit 30 is supported through holding unit rotating means 37 on the support cover 38b. Accordingly, the holding unit 30 is rotatable about a vertical axis extending in the Z direction by the holding unit rotating means 37.

The holding unit 30 has a circular shape as viewed in plan. The holding surface 31 of the holding unit 30 is lower in level in a circular central area 310 than in an annular peripheral area 311. In other words, the level of the central area 310 is lower than the level of the peripheral area 311. Accordingly, the workpiece W is supported on the holding surface 31 of the holding unit 30 only in the peripheral area 311. In other words, the peripheral area 311 functions as a supporting surface for supporting the workpiece W. More specifically, the back side Wb of the workpiece W is in contact with the supporting surface 311 in holding the workpiece W on the holding surface 31, and the central area 310 is spaced from the back side Wb of the workpiece W. As a modification, the holding surface 31 of the holding unit 30 may be flat circular holding surface without a level difference. In this case, the workpiece W may be held on the whole of the holding surface 31.

An annular groove 312 is formed on the supporting surface 311 of the holding unit 30. The annular groove 312 is filled with an annular plate-shaped porous member 32 having fine holes as the suction holes 320. The upper surface of the porous member 32 fitted in the annular groove 312 is flush with the supporting surface 311. The outer diameter of the porous member 32 is set in consideration of the diameter of the workpiece W. For example, the outer diameter of the porous member 32 is set slightly smaller than the diameter of the workpiece W. In the cutting operation of the processing apparatus 1, only the peripheral edge Wd of the workpiece W is annularly cut. Accordingly, the peripheral portion of the workpiece W is held under suction on the porous member 32 having the suction holes 320 opening to the holding surface 31 of the holding unit 30, thereby allowing proper cutting of the workpiece W. As a modification, the porous member 32 may be omitted. In this case, a plurality of suction holes may be formed on the supporting surface 311 so as to be arranged annularly at equal intervals in the circumferential direction of the supporting surface 311 or an annular suction groove may be formed on the supporting surface 311.

A plurality of through holes 303 are formed in the holding unit 30 so as to extend through the thickness thereof in such a manner that the through holes 303 open to the bottom of the annular groove 312 formed on the supporting surface 311 of the holding unit 30. The through holes 303 are arranged annularly at equal intervals in the circumferential direction of the holding unit 30. In the drawings, one of the through holes 303 is depicted for the convenience of illustration.

As depicted in FIG. 3, one end of the suction passage 33 is connected through a rotary joint or the like (not depicted) to the lower end of each through hole 303. The suction passage 33 is formed from a metal pipe or a flexible resin tube, for example. The suction means 339 is connected to the other end of the suction passage 33. The suction means 339 is configured by a vacuum producing apparatus or an ejector mechanism, for example. The suction passage 33 is provided with a solenoid valve 338 for making selective communication between the suction holes 320 of the porous member 32 and the suction means 339. In other words, when the solenoid valve 338 is opened and the suction means 339 is operated, a suction force produced by the suction means 339 is transmitted through the suction passage 33, the through holes 303, and the suction holes 320 to the supporting surface 311 of the holding surface 31 of the holding unit 30.

Further, the suction passage 33 is provided with a gas-liquid separator (not depicted) for separating a liquid from the air flowing in the suction passage 33. If the liquid is sucked to the suction means 339, the suction force produced by the suction means 339 is reduced. To cope with this problem, the gas-liquid separator is provided to separate the liquid from the air flowing in the suction passage 33, thereby preventing a reduction in the suction force by the suction means 339.

As depicted in FIGS. 2 and 3, a plurality of (e.g., three as depicted) through holes 310c are formed in the holding unit 30 in the central area 310 so as to extend through the thickness (in the Z direction) of the holding unit 30 in such a manner that the through holes 310c are arranged at equal intervals in the circumferential direction of the holding unit 30.

A plurality of pushup mechanisms 36 are provided inside the holding unit rotating means 37. Each pushup mechanism 36 functions to push up the workpiece W held under suction on the supporting surface 311 of the holding unit 30 and thereby separate the workpiece W from the holding unit 30. By operating each pushup mechanism 36, the back side Wb of the workpiece W is raised from the supporting surface 311, so that the workpiece W can be separated from the holding unit 30.

Each pushup mechanism 36 is configured by a motor-driven cylinder or an air cylinder, for example. In other words, each pushup mechanism 36 includes a pushup pin 360 slidably fitted in each through hole 310c. In other words, the plural pushup pins 360 respectively correspond to the plural through holes 310c. Each pushup pin 360 is adapted to project from the central area 310 of the holding unit 30 to a vertical position higher than the level of the supporting surface 311. Further, each pushup pin 360 is adapted to retract from the central area 310 of the holding unit 30. As a modification, the pushup mechanisms 36 may be omitted.

Referring back to FIG. 1, the processing apparatus 1 includes a first transfer mechanism 41 for transferring the workpiece W from the temporary setting table 141 to the holding unit 30 before processing, a second transfer mechanism 42 for transferring the workpiece W from the holding unit 30 to a back cleaning mechanism 50 after processing, and a third transfer mechanism 43 for transferring the workpiece W from the back cleaning mechanism 50 to a front cleaning mechanism 51 after processing. The back cleaning mechanism 50 and the front cleaning mechanism 51 are provided in the cleaning area A3. The first transfer mechanism 41 is provided in the processing area A2. The second transfer mechanism 42 is provided on the base 10 at a position near the standby position where the workpiece W is loaded to the holding unit 30. After processing the workpiece W in the cutting position, the workpiece W is moved from the cutting position to the standby position and then transferred to the back cleaning mechanism 50 by the second transfer mechanism 42.

The first transfer mechanism 41 is fixed through first elevating means 445 to a first moving arm 441. A horizontal support shaft 440 extends in the Y direction in the processing area A2. The first moving arm 441 is slidably supported to the side surface of the horizontal support shaft 440 so as to be movable in the Y direction.

Figure 4:
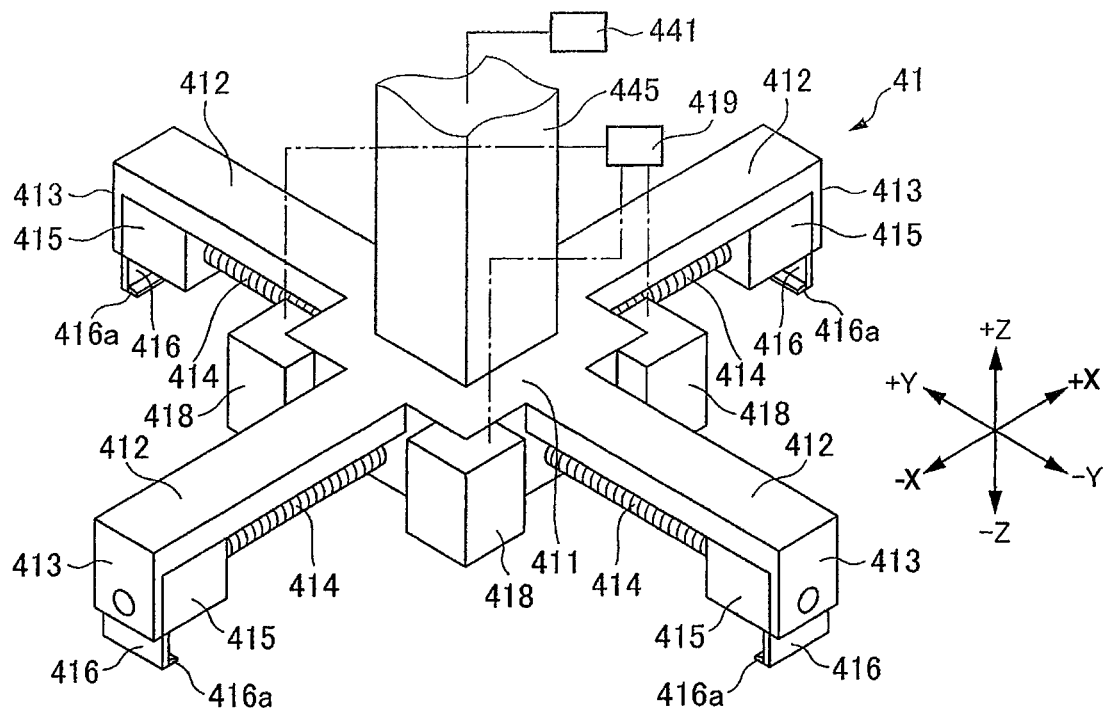
FIG. 4 is a perspective view of a first transfer mechanism.

FIG. 4 is a perspective view depicting the configuration of the first transfer mechanism 41. The configuration of the first transfer mechanism 41 depicted in FIG. 4 is merely illustrative. The second transfer mechanism 42 and the third transfer mechanism 43 depicted in FIG. 1 are similar in configuration to the first transfer mechanism 41. Accordingly, the description of the second transfer mechanism 42 and the third transfer mechanism 43 will be omitted.

The first transfer mechanism 41 is an edge clamp type transfer mechanism for holding the peripheral edge Wd of the workpiece W. The first transfer mechanism 41 includes a base portion 411 having a rectangular shape as viewed in plan and four elongated guide portions 412 horizontally extending from the four side surfaces of the base portion 411. The first elevating means 445 is connected at a lower end thereof to the upper surface of the base portion 411 and connected at an upper end thereof to the first moving arm 441. The first elevating means 445 is configured by a motor-driven cylinder or an air cylinder, for example. Thus, the first transfer mechanism 41 is movable both in the Z direction (vertical direction) and in the Y direction by the first moving arm 441 and the first elevating means 445.

Each guide portion 412 has a front end as a support wall 413 projecting downward so as to be opposed to the corresponding side surface of the base portion 411. A horizontally extending ball screw 414 is supported at its opposite ends to the support wall 413 and the corresponding side surface of the base portion 411. A movable block 415 is threadedly engaged with each ball screw 414 through a nut portion formed inside the movable block 415. The movable block 415 has a shape like a rectangular prism. Each ball screw 414 is connected to a motor (not depicted) provided inside the base portion 411.

A hook member 416 having a lower end 416a is integrally connected to the lower surface of each movable block 415. The hook member 416 is adapted to come into contact with the peripheral edge Wd of the workpiece W. The hook member 416 has an L-shaped cross section such that the lower end 416a is directed toward the base portion 411. Thus, the four hook members 416 of the first transfer mechanism 41 are annularly arranged so as to hold the peripheral edge Wd of the workpiece W on the back side Wb.

Figure 5:
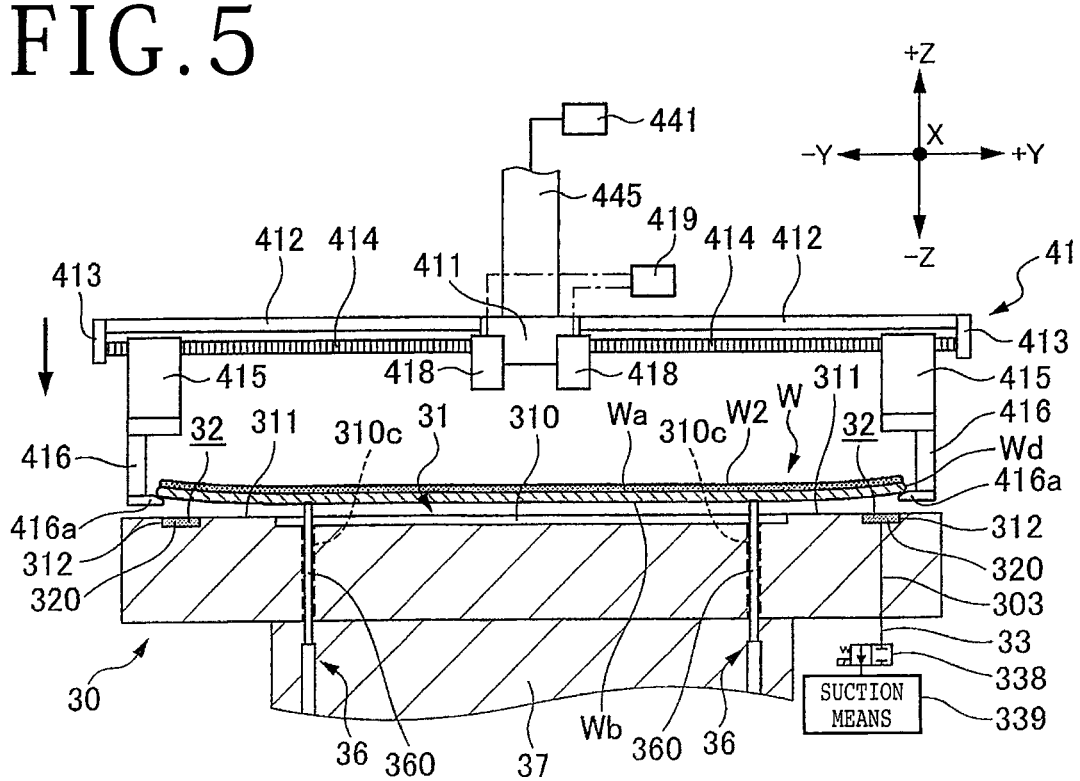
FIG. 5 is a sectional view depicting a mounting step of holding the workpiece by using the first transfer mechanism and then mounting the workpiece on a holding surface of the holding unit by using the first transfer mechanism.

The ball screw 414 is rotated forwardly or reversely by the corresponding motor, so that the movable block 415 is linearly moved in a horizontal direction as being guided by the lower surface of the corresponding guide portion 412 in a condition where the amount of movement of the movable block 415 is grasped. At this time, the hook member 416 connected to each movable block 415 is movable between a standby position where the hook member 416 is spaced from the peripheral edge Wd of the workpiece W and a working position where the hook member 416 has been moved in the radial direction of the workpiece W from the standby position to hold the peripheral edge Wd of the workpiece W. As depicted in FIG. 5, when each movable block 415 is moved to come close to the peripheral edge Wd of the workpiece W and the back side Wb of the workpiece W is placed on the lower end 416a of each hook member 416, the peripheral edge Wd of the workpiece W is held by the first transfer mechanism 41.

As a modification, each hook member 416 may be provided with a noncontact type sensor (not depicted) having a detecting surface oriented in the direction where the hook member 416 comes close to the peripheral edge Wd of the workpiece W. The noncontact type sensor is configured by a capacitance type sensor or a laser sensor, for example. The capacitance type sensor is a sensor such that a capacitor is formed between the sensor and the outer circumferential surface of the workpiece W and a change in capacitance of the capacitor is detected to detect the distance between the hook member 416 and the outer circumferential surface of the workpiece W. The laser sensor is a sensor such that measuring light is generated to be applied to the outer circumferential surface of the workpiece W and the reflected light from the outer circumferential surface of the workpiece W is detected, in which the time from the generation of the measuring light to the detection of the reflected light is measured to detect the distance between the hook member 416 and the outer circumferential surface of the workpiece W. Thus, the noncontact type sensor functions to detect the approach of the hook member 416 to the outer circumferential surface of the workpiece W, thereby preventing the contact between the hook member 416 and the outer circumferential surface of the workpiece W to avoid the possibility that the workpiece W may be bent toward the center thereof to cause damage. In other words, the lower end 416a of each hook member 416 does not come into contact with the outer circumferential surface of the workpiece W, but can support the peripheral edge Wd of the workpiece W on the back side Wb.

The configuration of the first transfer mechanism 41 is not limited to that depicted in FIG. 4. For example, three guide portions 412 may extend from the base portion 411 so as to be equally spaced in the circumferential direction, that is, so as to be arranged at intervals of 120 degrees. Accordingly, in this case, the first transfer mechanism 41 may have three hook members 416 respectively provided on the three guide portions 412, so that the peripheral edge Wd of the workpiece W on the back side Wb may be held by the three hook members 416.

The first transfer mechanism 41 is further provided with four liquid supply nozzles 418 for supplying a liquid (e.g., water) to the workpiece W in the form of drops. The four liquid supply nozzles 418 are located at the four corners of the base portion 411. The liquid supply nozzles 418 are positioned at a level higher than that of the hook members 416 for holding the workpiece W. While each liquid supply nozzle 418 has a shape like a block in this preferred embodiment, the shape of each liquid supply nozzle 418 is not limited. Each liquid supply nozzle 418 has a nozzle hole (not depicted) formed on the lower surface so as to open in the −Z direction. Each liquid supply nozzle 418 is connected through a flexible resin tube (not depicted) to a liquid source 419 for storing a liquid (e.g., pure water). The location of each liquid supply nozzle 418 is not limited and the number of the liquid supply nozzles 418 is not limited. In other words, three or less liquid supply nozzles 418 may be provided or five or more liquid supply nozzles 418 may be provided.

While the second transfer mechanism 42 and the third transfer mechanism 43 are similar in configuration to the first transfer mechanism 41 in this preferred embodiment, the first transfer mechanism 41 may not have the liquid supply nozzles 418, but the second transfer mechanism 42 and the third transfer mechanism 43 may have the liquid supply nozzles 418.

Referring back to FIG. 1, a double-column type support member 14 is provided on the base 2 in the processing area A2 so as to straddle the path of movement of the holding unit 30 in the X direction. An indexing mechanism 16 is provided on the side surface of the double-column type support member 14. The indexing mechanism 16 functions to move the first cutting unit 61 or the second cutting unit 62 back and forth in the Y direction.

The indexing mechanism 16 includes a ball screw 160 having an axis extending in the Y direction, a pair of guide rails (not depicted) extending parallel to the ball screw 160, a motor 162 connected to one end of the ball screw 160, a first movable plate 163 having an internal nut portion threadedly engaged with the ball screw 160 and a side portion slidably mounted on the guide rails, the first movable plate 163 being connected to the first cutting unit 61, and a second movable plate 164 having an internal nut portion threadedly engaged with the ball screw 160 and a side portion slidably mounted on the guide rails, the second movable plate 164 being connected to the second cutting unit 62. Accordingly, when the ball screw 160 is rotated by the motor 162, the first movable plate 163 (the second movable plate 164) is moved in the Y direction as being guided by the guide rails, the first cutting unit 61 (the second cutting unit 62) is moved (indexed) in the Y direction. The first cutting unit 61 (the second cutting unit 62) is connected through a first cutter feeding mechanism 171 (a second cutter feeding mechanism 172) to the first movable plate 163 (the second movable plate 164).

The first cutter feeding mechanism 171 (the second cutter feeding mechanism 172) functions to move the first cutting unit 61 (the second cutting unit 62) back and forth in the Z direction. For example, the first cutter feeding mechanism 171 (the second cutter feeding mechanism 172) is a ball screw mechanism having a first ball screw 171a (a second ball screw 172a) and a first motor (a second motor), the motor not depicted, for rotating the first ball screw 171a (the second ball screw 172a). A first movable block 171b (a second movable block 172b) is threadedly engaged with the first ball screw 171a (the second ball screw 172a). The first cutting unit 61 (the second cutting unit 62) is fixed to the first movable block 171b (the second movable block 172b). Accordingly, when the first ball screw 171a (the second ball screw 172a) is rotated by the first motor (the second motor), the first movable block 171b (the second movable block 172b) is moved back and forth in the Z direction to thereby move the first cutting unit 61 (the second cutting unit 62) back and forth in the Z direction.

The first cutting unit 61 includes a spindle 610 having an axis extending in the Y direction, a housing 611 fixed to the first movable block 171b for rotatably supporting the spindle 610, a motor (not depicted) for rotating the spindle 610, and a cutting blade 613 mounted on the spindle 610 at its front end. Accordingly, when the spindle 610 is rotated by the motor, the cutting blade 613 is rotated with the spindle 610. The first cutting unit 61 further includes a nozzle (not depicted) for spraying a cutting water to a position where the cutting blade 613 comes into contact with the workpiece W. The second cutting unit 62 is similar in configuration to the first cutting unit 61. In FIG. 1, the same parts as those of the first cutting unit 61 are denoted by the same reference numerals. The cutting blade 613 of the second cutting unit 62 is opposed to the cutting blade 613 of the first cutting unit 61 in the Y direction.

The processing apparatus 1 further includes an alignment unit 65 capable of recognizing a coordinate position on the peripheral edge Wd of the workpiece W and a coordinate position of the center of the workpiece W. For example, the alignment unit 65 is mounted on the side surface of the housing 611 of the first cutting unit 61. The alignment unit 65 includes light applying means (not depicted) for applying light to the workpiece W and a camera for forming an image of the workpiece W. The camera includes an optical system for capturing the reflected light from the workpiece W and an imaging device for outputting an electrical signal corresponding to the image formed by the optical system.

The second transfer mechanism 42 functions to transfer the workpiece W processed on the holding unit 30 from the holding unit 30 to the back cleaning mechanism 50 provided in the cleaning area A3. As described above, the second transfer mechanism 42 is similar in configuration to the first transfer mechanism 41 depicted in FIG. 4. In FIG. 4, the same parts as those of the first transfer mechanism 41 are denoted by the same reference numerals. The second transfer mechanism 42 has a similar base portion 411, and second elevating means 446 such as a motor-driven cylinder or an air cylinder is connected to the upper surface of the base portion 411 of the second transfer mechanism 42. Accordingly, the second transfer mechanism 42 is vertically movable in the Z direction by the second elevating means 446. A horizontally extending second moving arm 452 is connected to the second elevating means 446. The second moving arm 452 is rotatably supported through a rotating shaft 453 to the base 10. The rotating shaft 453 has an axis extending in the Z direction.

There are provided in the cleaning area A3 the back cleaning mechanism 50 for cleaning the back side Wb of the workpiece W and the front cleaning mechanism 51 for cleaning the mold layer W2 (see FIG. 2) formed on the front side Wa of the workpiece W. In the back cleaning mechanism 50, a cleaning water is sprayed to the back sided Wb of the workpiece W from the under side thereof and at the same time the back side Wb of the workpiece W is rubbed by a sponge or the like.

The third transfer mechanism 43 is also similar in configuration to the first transfer mechanism 41 depicted in FIG. 4. In FIG. 1, the same parts as those of the first transfer mechanism 41 are denoted by the same reference numerals. The third transfer mechanism 43 has a similar base portion 411, and third elevating means 447 such as a motor-driven cylinder or an air cylinder is connected to the upper surface of the base portion 411 of the third transfer mechanism 43. Accordingly, the third transfer mechanism 43 is vertically movable in the Z direction by the third elevating means 447. A third moving arm 463 is connected to the third elevating means 447. A horizontal support shaft 461 linearly extends in the Y direction in the cleaning area A3. The third moving arm 463 is slidably supported to the side surface of the horizontal support shaft 461 so as to be movable in the Y direction.

The processing apparatus 1 described above is used to perform the workpiece holding method according to the present invention and the workpiece processing method for processing the workpiece W held by the workpiece holding method. The steps of the workpiece holding method and the steps of the workpiece processing method will now be described. The workpiece W depicted in FIGS. 2 and 3 is a semiconductor wafer manufactured by a chip on wafer (COW) process, for example. More specifically, the workpiece W is a circular semiconductor wafer formed of silicon, for example, as a base material. The front side Wa of the workpiece W is partitioned by a plurality of crossing division lines to define a plurality of rectangular separate regions where a plurality of devices having electrode pads, bumps, and the like are respectively formed. The front side Wa is molded with a predetermined resin to form the mold layer W2 having a uniform thickness. In other words, the plural devices having electrode pads, bumps, and the like are sealed in the mold layer W2. The workpiece W may be formed of any other base materials such as gallium arsenide, sapphire, gallium nitride, and silicon carbide.

As depicted in FIGS. 2 and 3, the back side Wb of the workpiece W is an exposed surface (lower surface) of the workpiece W. The workpiece W is generally curved in such a manner that the front side Wa is recessed at the central portion of the workpiece W due to a thermal effect in forming the mold layer W2 (due to shrinkage of the mold layer W2). In other words, the workpiece W has a bowl-shaped warp. The bowl-shaped warp means a warp such that when the workpiece W is placed on the holding surface 31 of the holding unit 30 in a condition where the back side Wb is oriented downward as depicted in FIG. 3, the workpiece W is curved like a bowl on the holding surface 31, that is, the level of the back side Wb of the workpiece W is gradually lowered from the peripheral area to the central area of the workpiece W. Further, the peripheral edge Wd of the workpiece W is chamfered. In other words, the peripheral edge Wd has a chamfered portion having an arcuate cross section. A dicing tape (not depicted) is attached to the back side Wb of the workpiece W.

The workpiece W is not limited to such a semiconductor wafer having a configuration that the mold layer W2 is formed on the front side Wa. For example, the workpiece W may be a stacked wafer or package substrate having a bowl-shaped warp as formed by stacking a plurality of wafers and bonding them together through adhesive layers of resin or the like.

(1) Mounting Step in the Holding Method

First, the robot 13 depicted in FIG. 1 is operated to draw one of the workpieces W from the first cassette 150a and then move the workpiece W to the temporary setting table 141, in which the workpieces W are previously stored in the first cassette 150a so as to be supported on shelves. Thereafter, the workpiece W is centered by the centering means (not depicted).

Thereafter, the first transfer mechanism 41 is moved to the position above the temporary setting table 141 in the −Y direction by the first moving arm 441 and then positioned so that the center of the first transfer mechanism 41 coincides with the center of the workpiece W. At this time, the four hook members 416 of the first transfer mechanism 41 are previously set at the standby position where the lower end 416a of each hook member 416 is spaced radially outward from the peripheral edge Wd of the workpiece W. Thereafter, the first transfer mechanism 41 is lowered by the first elevating means 445 toward the temporary setting table 141 until the level of the lower end 416a of each hook member 416 becomes a level where the lower end 416a can be inserted into a gap between the back side Wb of the workpiece W and the upper surface of the temporary setting table 141.

Thereafter, each ball screw 414 is rotated to move each hook member 416 toward the outer circumferential surface of the workpiece W. Accordingly, the lower end 416a of each hook member 416 is inserted into the gap between the back side Wb of the workpiece W at the peripheral edge Wd and the upper surface of the temporary setting table 141. Accordingly, the peripheral edge Wd of the workpiece W on the back side Wb is supported by the four hook members 416.

Thus, the peripheral edge Wd of the workpiece W on the back side Wb is caught by the lower end 416a of each hook member 416. In this manner, the peripheral edge Wd of the workpiece W is supported by the first transfer mechanism 41. Thereafter, the first transfer mechanism 41 is raised by the first elevating means 445 to thereby raise the workpiece W from the temporary setting table 141 and then transfer the workpiece W toward the holding unit 30 in the standby position.

The first transfer mechanism 41 is moved to the position above the holding unit 30 in the +Y direction by the first moving arm 441 and then positioned so that the center of the workpiece W held by the first transfer mechanism 41 coincides with the center of the holding unit 30. At this time, as depicted in FIG. 5, the pushup pins 360 of the pushup mechanism 36 are previously projected from the holding surface 31 of the holding unit 30 in such a manner that the upper end of each pushup pin 360 is higher in level than the supporting surface 311 of the holding unit 30.

Figure 6:
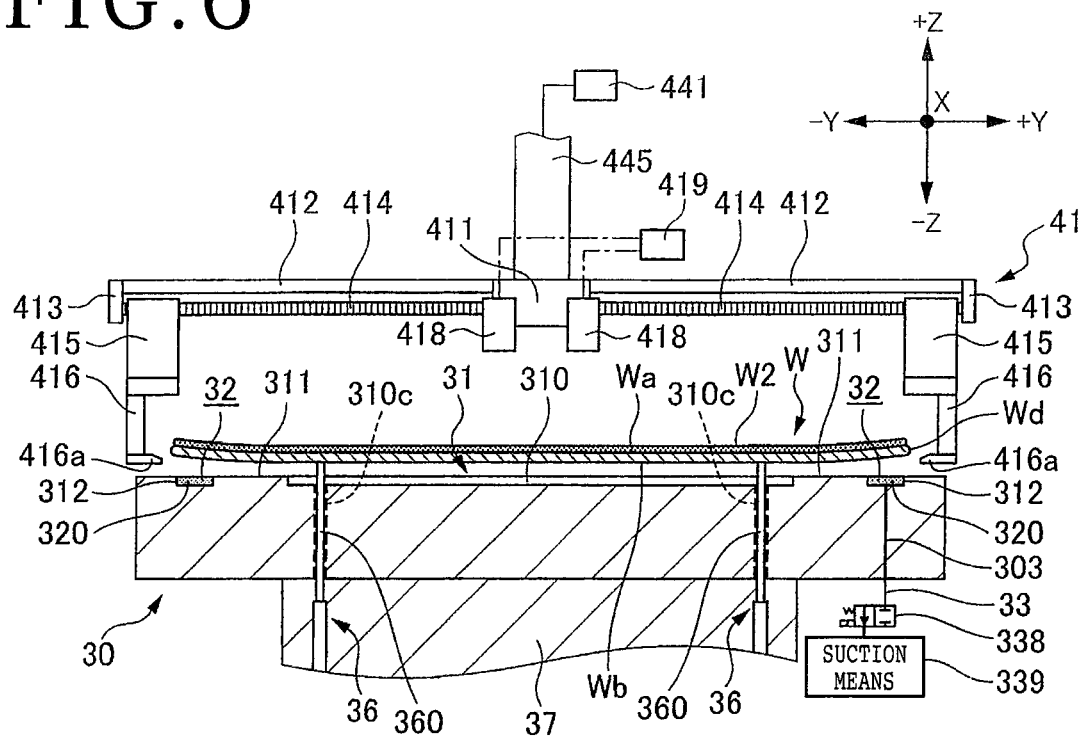
FIG. 6 is a view similar to FIG. 5, depicting a condition where the mounting step is finished.

Thereafter, the first transfer mechanism 41 is lowered in the −Z direction by the first elevating means 445 until the back side Wb of the workpiece W comes into contact with the upper end of each pushup pin 360 as depicted in FIG. 5. Then, the lowering of the first transfer mechanism 41 is stopped. Thereafter, each ball screw 414 depicted in FIG. 6 is rotated to move each hook member 416 away from the peripheral edge Wd of the workpiece W. In other words, the lower end 416a of each hook member 416 is separated from the peripheral edge Wd of the workpiece W. As a result, the workpiece W is supported by only the three pushup pins 360 (only two of which being depicted in FIG. 6).

Figure 7:
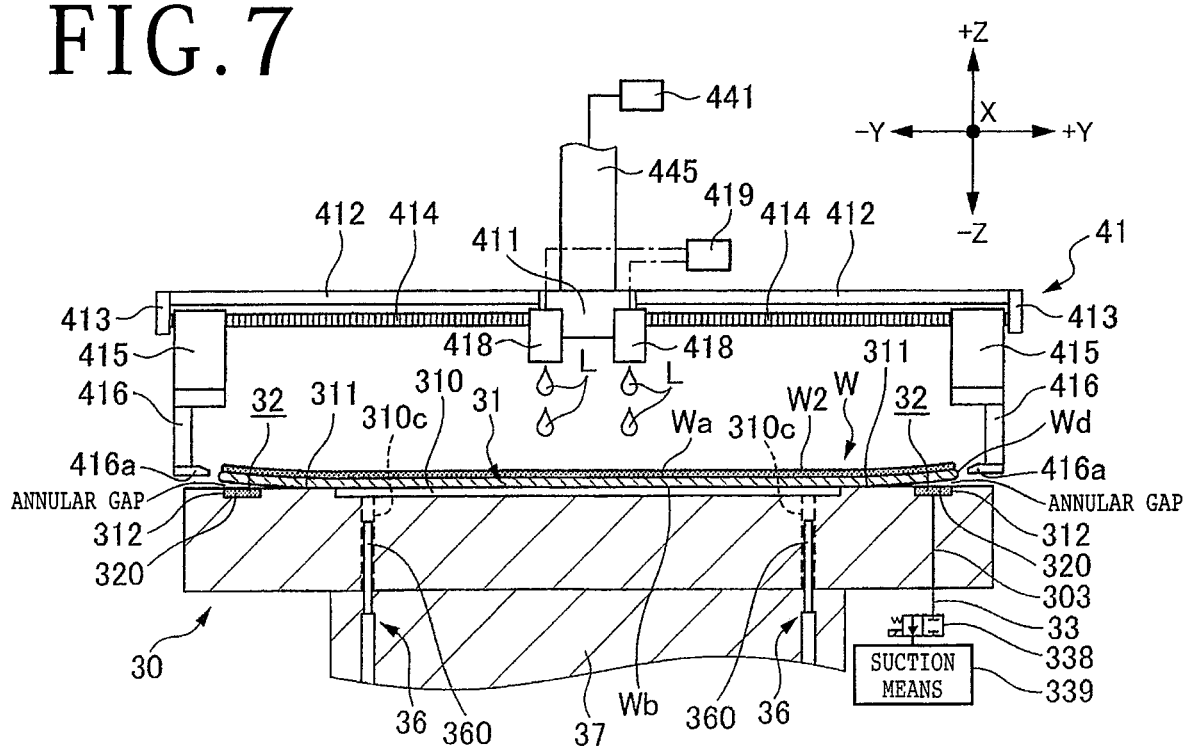
FIG. 7 is a sectional view depicting a liquid supplying step of supplying a liquid from the first transfer mechanism to the workpiece held on the holding surface so that the liquid flows into a gap defined between the holding surface and the workpiece to fill the gap.

Thereafter, each pushup pin 360 is lowered in each through hole 310c until the upper end of each pushup pin 360 becomes lower in level than the supporting surface 311 of the holding surface 31 of the holding unit 30. Accordingly, the workpiece W is also lowered by the lowering of each pushup pin 360, so that the peripheral area of the back side Wb of the workpiece W is supported by the annular supporting surface 311. The level of the central area 310 of the holding unit 30 is lower than the level of the supporting surface 311 formed outside the central area 310. Accordingly, only the annular supporting surface 311 as a part of the holding surface 31 of the holding unit 30 comes into contact with the workpiece W, so that possible adherence of dust to the back side Wb of the workpiece W can be suppressed. Since the workpiece W has a bowl-shaped warp, an annular gap is defined between the peripheral area of the back side Wb of the workpiece W and the supporting surface 311 as depicted in FIG. 7. In this manner, the workpiece W is mounted on the holding surface 31 of the holding unit 30, and the mounting step is finished.

(2) Liquid Supplying Step in the Holding Method

Thereafter, a liquid L (pure water) is supplied to the workpiece W mounted on the holding surface 31 of the holding unit 30, thereby making the liquid L flow into the gap between the holding surface 31 and the back side Wb of the workpiece W. More specifically, as depicted in FIG. 7, the liquid L (pure water) is dropped by a suitable amount from the liquid supply nozzles 418 of the first transfer mechanism 41 set above the workpiece W, toward the central area of the mold layer W2 of the workpiece W. In a case where the first transfer mechanism 41 does not include the liquid supply nozzles 418 and the second transfer mechanism 42 includes the liquid supply nozzles 418, the second transfer mechanism 42 may be set above the workpiece W held on the holding unit 30 and the liquid L may be supplied from the liquid supply nozzles 418 of the second transfer mechanism 42 to the workpiece W. As a modification, a liquid supply nozzle may be provided adjacent to the holding unit 30 at a position outside the outer circumference thereof. In this case, the liquid L may be supplied from the liquid supply nozzle toward the mold layer W2 of the workpiece W so as to describe a parabola.

Figure 8:
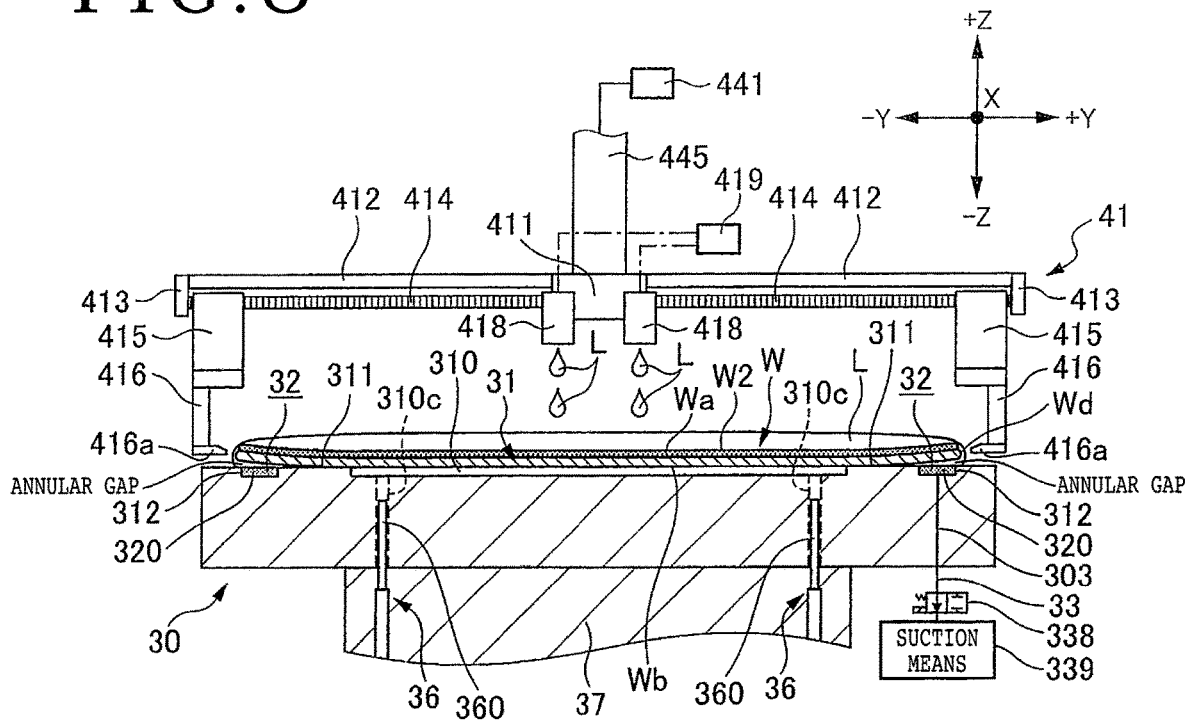
FIG. 8 is a sectional view depicting a suction step of bringing a suction hole opening to the holding surface into communication with suction means for producing a suction force to suck the liquid and the workpiece and thereby hold the workpiece through the liquid on the holding surface under suction.

The liquid L supplied to the mold layer W2 is accumulated on the mold layer W2 and spread radially outward to exceed the peripheral edge of the mold layer W2 and flow into the gap between the peripheral area of the back side Wb of the workpiece W and the supporting surface 311 as depicted in FIG. 8. Thus, the gap is filled with the liquid L. Thereafter, the liquid L is further accumulated on the mold layer W2 by a predetermined amount due to surface tension to continuously make a condition that the gap is filled with the liquid L. Thereafter, a suction step is performed.

In a case of holding the workpiece W on the holding unit 30, it is considered that the liquid L may be supplied to the holding surface 31 before mounting the workpiece W on the holding surface 31 and the workpiece W may be next mounted on a liquid layer formed on the holding surface 31, thereby filling the gap between the peripheral area of the back side Wb of the workpiece W and the supporting surface 311 with the liquid L to thereby prevent the leak of a suction force from the gap. However, there is a possibility of displacement of the workpiece W floating on the liquid L supplied to the holding surface 31, before holding the workpiece W on the holding surface 31 under suction. To the contrary, the workpiece holding method according to the present invention includes the above liquid supplying step of supplying the liquid L to the workpiece W mounted on the holding surface 31 and thereby filling the gap with the liquid L, so that the displacement of the workpiece W on the holding surface 31 can be prevented.

(3) Suction Step in the Holding Method

After performing the liquid supplying step, the suction holes 320 in the porous member 32 are brought into communication with the suction means 339 to thereby suck the liquid L and the workpiece W, thereby holding the workpiece W on the supporting surface 311 of the holding surface 31 of the holding unit 30. Preferably, until the workpiece W is held on the supporting surface 311 under suction, the liquid L continues to be supplied from the liquid supply nozzles 418 of the first transfer mechanism 41 to the workpiece W.

In the suction step, the solenoid valve 338 is opened to make the communication between the suction holes 320 in the porous member 32 and the suction means 339. Thereafter, the suction means 339 is operated to transmit a suction force produced by the suction means 339 through the suction passage 33, the through holes 303 of the holding unit 30, and the suction holes 320 of the porous member 32 to the supporting surface 311. As a result, the liquid L is sucked from the suction holes 320 to the suction passage 33, and the workpiece W is also sucked together with the liquid L and thereby held on the supporting surface 311 under suction against the bowl-shaped warp. Accordingly, the workpiece W becomes flat on the holding surface 31. In sucking the workpiece W, sealability can be improved by the liquid L filling the gap between the peripheral area of the back side Wb of the workpiece W and the supporting surface 311, thereby preventing the leak of a suction force from the gap. Accordingly, the workpiece W can be reliably held on the holding surface 31 under suction. After holding the workpiece W on the holding surface 31 under suction, the supply of the liquid L from the first transfer mechanism 41 to the workpiece W is stopped.

(4) Processing Step in the Processing Method

Figure 9:
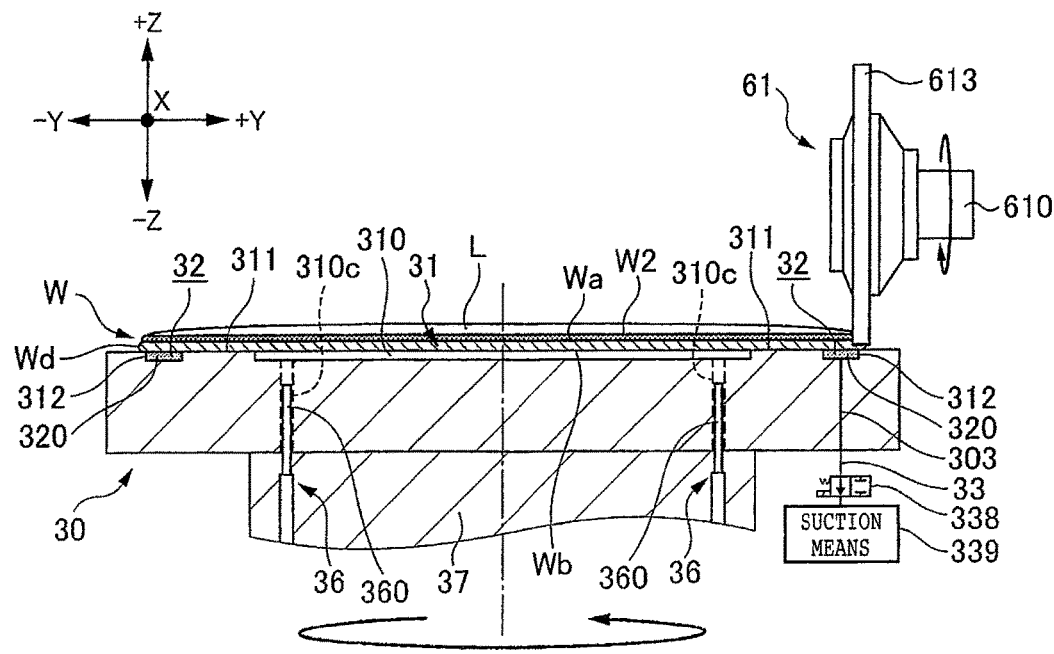
FIG. 9 is a sectional view depicting a processing step of annularly cutting the workpiece along a peripheral edge thereof by using a cutting blade after performing the suction step.

Thereafter, the holding unit 30 holding the workpiece W under suction is moved to the cutting position in the +X direction. For example, the holding unit 30 is set below the first cutting unit 61. In the processing step, the workpiece W and the mold layer W2 are cut along the outer circumference thereof by using the cutting blade 613 of the first cutting unit 61 as depicted in FIG. 9, thereby forming an annular groove along the peripheral edge Wd of the workpiece W (edge trimming).

First, the alignment unit 65 depicted in FIG. 1 is operated to perform edge alignment for the workpiece W in the following manner. The holding unit 30 is rotated and the camera of the alignment unit 65 is operated to image the peripheral edge Wd of the workpiece W held on the holding unit 30 at a plurality of positions. According to images obtained, the coordinates at three separate points on the peripheral edge Wd, for example, are detected and geometrical computing based on the coordinates at the three points is performed to accurately determine the coordinates of the center of the workpiece W.

According to the information regarding the coordinates of the center of the workpiece W determined above and the information regarding the size of the workpiece W previously recognized, the holding unit 30 is moved in the X direction and the first cutting unit 61 is moved in the Y direction to thereby perform the alignment between the holding unit 30 and the first cutting unit 61 so that a predetermined position radially inside the peripheral edge Wd of the workpiece W by a predetermined distance is set directly below the cutting blade 613. By this alignment, the cutting blade 613 is positioned so that approximately ⅔ of the thickness of the cutting blade 613 comes into contact with the peripheral area of the workpiece W along the peripheral edge Wd.

Thereafter, the spindle 610 is rotated by the motor at a high speed in a clockwise direction as viewed in the +Y direction, so that the cutting blade 613 fixed to the spindle 610 is rotated at the high speed in the same direction. Further, the first cutter feeding mechanism 171 depicted in FIG. 1 is operated to lower the first cutting unit 61 in the −Z direction, thereby feeding the cutting blade 613 into the mold layer W2 and the workpiece W to a predetermined depth. For example, the depth of cut by the cutting blade 613 is determined according to the amount of grinding of the workpiece W in a grinding operation to be performed after this edge trimming of the workpiece W. After feeding the cutting blade 613 to the predetermined depth, the holding unit 30 is rotated 360 degrees in a counterclockwise direction as viewed in the −Z direction in the condition where the cutting blade 613 continues to be rotated at the high speed, thereby annularly cutting the workpiece W along the peripheral edge Wd. At this time, a cutting water is supplied from the nozzle included in the first cutting unit 61 to the position where the cutting blade 613 comes into contact with the workpiece W, thereby cleaning and cooling the contact position.

The processing step is not limited to such edge trimming of the peripheral edge Wd of the workpiece W by the cutting blade 613, thereby removing the chamfered portion. For example, the processing step may be a half-cutting operation or full-cutting operation of cutting the workpiece W along each division line.

(5) Unloading Step in the Processing Method

After performing the processing step, the second transfer mechanism 42 depicted in FIG. 1 is operated to hold the workpiece W and then unload the workpiece W from the holding surface 31 of the holding unit 30. In the unloading step, the liquid L is supplied from the liquid supply nozzles 418 of the second transfer mechanism 42 to the mold layer W2 of the workpiece W as depicted in FIG. 10.

More specifically, in the unloading step, the holding unit 30 holding the workpiece W under suction is moved to the standby position in the −X direction. In other words, the workpiece W held on the holding unit 30 is set within the range of movement of the second transfer mechanism 42. As depicted in FIG. 10, the solenoid valve 338 is first closed to cut off the transmission of the suction force produced by the suction means 339 to the supporting surface 311. Accordingly, the suction holding of the workpiece W by the holding unit 30 is canceled. Thereafter, the pushup pins 360 of the pushup mechanism 36 are raised to project from the central area 310 of the holding unit 30 so that the upper end of each pushup pin 360 becomes higher in level than the supporting surface 311. Accordingly, the workpiece W held on the supporting surface 311 of the holding surface 31 is raised by the three pushup pins 360 to remove a vacuum attraction force left between the workpiece W and the supporting surface 311, so that the workpiece W is separated from the supporting surface 311. Accordingly, a gap for allowing the insertion of the lower end 416a of each hook member 416 of the second transfer mechanism 42 is formed between the holding unit 30 and the workpiece W.

Figure 10:
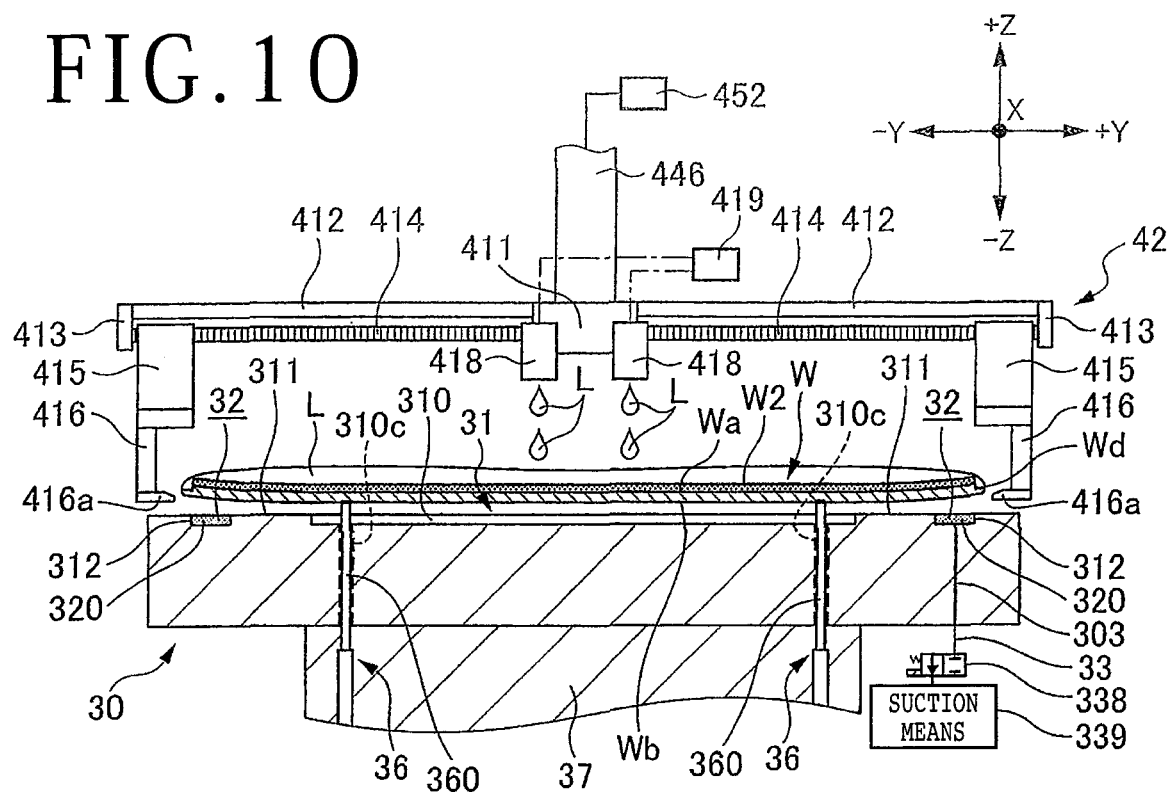
FIG. 10 is a sectional view depicting an unloading step of holding the workpiece by using a second transfer mechanism after performing the processing step, and then unloading the workpiece from the holding surface by using the second transfer mechanism.

Thereafter, the second transfer mechanism 42 is moved by the second moving arm 452 so as to be horizontally rotated about the axis of the rotating shaft 453 depicted in FIG. 10 to reach the position above the holding unit 30 set in the standby position in such a manner that the center of the second transfer mechanism 42 coincides with the center of the workpiece W held on the holding unit 30. At this time, the four hook members 416 of the second transfer mechanism 42 are previously set in the standby position where the lower end 416a of each hook member 416 is spaced radially outward from the peripheral edge Wd of the workpiece W. Thereafter, the second transfer mechanism 42 is lowered so that the level of the lower end 416a of each hook member 416 becomes a level where the lower end 416a can be inserted into the gap between the back side Wb of the workpiece W and the supporting surface 311.

Thereafter, the liquid L (pure water) is dropped by a suitable amount from the liquid supply nozzles 418 of the second transfer mechanism 42 toward the central area of the mold layer W2 of the workpiece W. The reason for supplying the liquid L is to prevent adherence of cutting dust generated in the processing step to the mold layer W2 dried during the transfer of the workpiece W to the back cleaning mechanism 50 depicted in FIG. 1. However, the workpiece W may be transferred by the second transfer mechanism 42 without supplying the liquid L.

Figure 11:
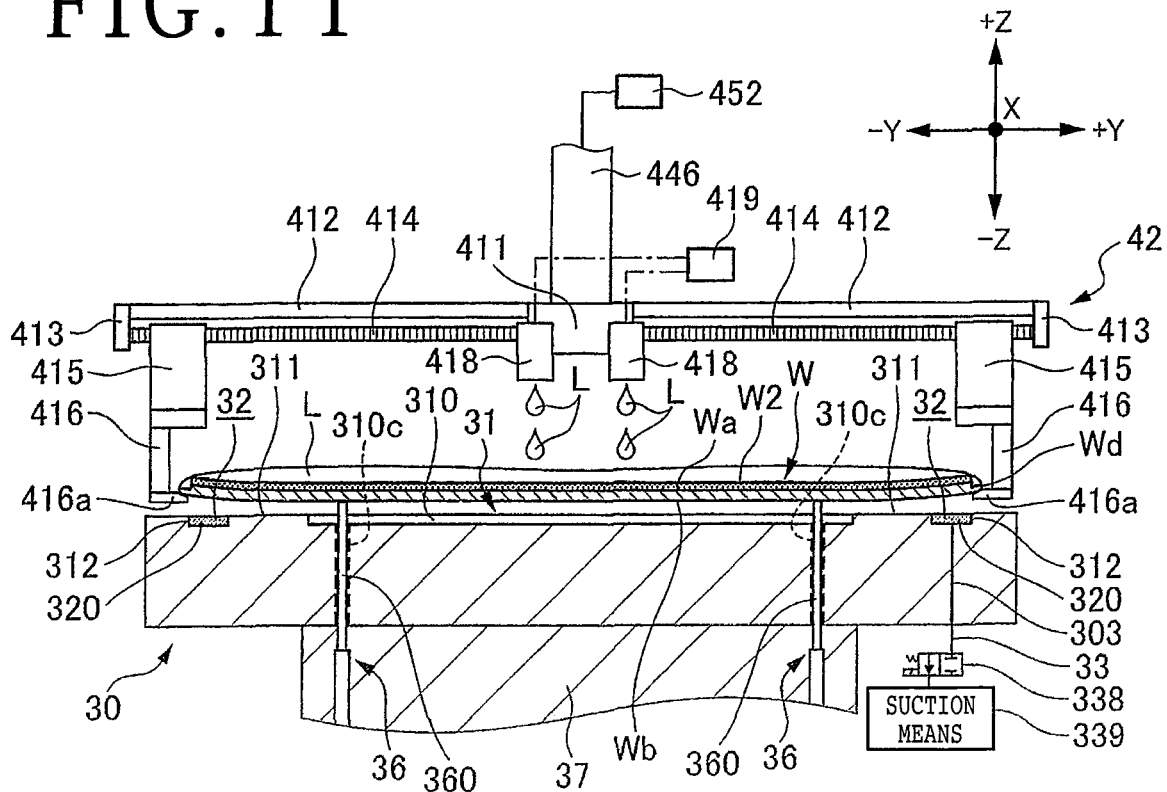
FIG. 11 is a view similar to FIG. 10, depicting a condition where the unloading step is finished.

Thereafter, each ball screw 414 depicted in FIG. 10 is rotated to move each hook member 416 toward the outer circumferential surface of the workpiece W, and the lower end 416a of each hook member 416 is inserted into the gap between the back side Wb of the workpiece W at the peripheral edge Wd and the supporting surface 311. Accordingly, the back side Wb of the workpiece W at the peripheral edge Wd is supported by the four hook members 416 of the second transfer mechanism 42 as depicted in FIG. 11.

Thus, the peripheral edge Wd of the workpiece W on the back side Wd is caught by the lower end 416a of each hook member 416, so that the peripheral edge Wd of the workpiece W is supported by the second transfer mechanism 42. Thereafter, the second transfer mechanism 42 is raised by the second elevating means 446 to thereby separate the workpiece W from the pushup pins 360. Thereafter, the workpiece W is transferred to the back cleaning mechanism 50 by the second transfer mechanism 42.

In the back cleaning mechanism 50, a cleaning water is sprayed to the back side Wb of the workpiece W, and the back side Wb is rubbed by a sponge being rotated. Thus, the back side Wb of the workpiece W is cleaned. Thereafter, the workpiece W is picked up from the back cleaning mechanism 50 by the third transfer mechanism 43. Thereafter, the workpiece W is transferred to the front cleaning mechanism 51 by the third moving arm 463. The workpiece W is held by the third transfer mechanism 43 in a manner similar to that by the second transfer mechanism 42. The liquid L (pure water) is supplied from the third transfer mechanism 43 to the mold layer W2 of the workpiece W, so as to prevent adherence of the cutting dust to the mold layer W2 dried. At the same time, the workpiece W is mounted on a spinner table 511 included in the front cleaning mechanism 51 by the third transfer mechanism 43. In the front cleaning mechanism 51, the spinner table 511 holding the workpiece W is lowered into a cleaning chamfer formed in the base 10. In the cleaning chamber, a cleaning water is sprayed to the mold layer W2 formed on the front side Wa of the workpiece W, thereby cleaning the mold layer W2. Thereafter, a dry air is blown against the mold layer W2 to dry the workpiece W. Thereafter, the workpiece W is picked up from the spinner table 511 by the robot 13 and next stored into the second cassette 151a by the robot 13.

As described above, the holding method for holding the workpiece W having a bowl-shaped warp according to the present invention includes the mounting step of mounting the workpiece W on the holding unit 30, the liquid supplying step of supplying the liquid L to the workpiece W held on the holding unit 30, and the suction step of holding the workpiece W through the liquid L on the holding unit 30 under suction. In the mounting step, the holding unit 30 has the holding surface 31 for holding the workpiece W, the suction holes 320 opening to the holding surface 31, and the suction passage 33 for making selective communication between the suction holes 320 and the suction means 339. The workpiece W is mounted on the holding surface 31 of the holding unit 30. In the liquid supplying step, the liquid L is supplied to the workpiece W mounted on the holding surface 31 so that the liquid L flows into the gap between the holding surface 31 and the workpiece W to fill the gap. In the suction step, the suction holes 320 are brought into communication with the suction means 339 to suck the liquid L and the workpiece W and thereby hold the workpiece W through the liquid L on the holding surface 31 under suction. Accordingly, a leak of a suction force produced by the suction means 339 can be prevented on the holding surface 31. Further, the workpiece W having a bowl-shaped warp can be held under suction without pressing the workpiece W.

In the mounting step according to this preferred embodiment, the workpiece W is held by the first transfer mechanism 41 and then mounted on the holding surface 31 by using the first transfer mechanism 41. In the liquid supplying step according to this preferred embodiment, water is supplied as the liquid L from the first transfer mechanism 41. Accordingly, the mounting step and the liquid supplying step can be smoothly performed.

The processing method for processing the workpiece W held by using the holding method according to the present invention includes the processing step of processing the workpiece W after performing the suction step and the unloading step of holding the workpiece W by using the second transfer mechanism 42 after performing the processing step, and then unloading the workpiece W from the holding surface 31 of the holding unit 30 by using the second transfer mechanism 42. Accordingly, the workpiece W can be smoothly unloaded from the holding surface 31 after suitably processing the workpiece W.

In the processing method according to this preferred embodiment, the workpiece W is a semiconductor wafer, and the cutting blade 613 is used to annularly cut the semiconductor wafer along the peripheral edge Wd. Accordingly, when the peripheral edge Wd of the semiconductor wafer has a chamfered portion, this chamfered portion can be suitably cut out by the cutting blade 613.

The workpiece holding method and the workpiece processing method according to the present invention are not limited to the above preferred embodiment. Further, the configuration of the components of the processing apparatus 1 is not limited to that depicted in the attached drawings, but may be suitably modified within the scope where the effects of the present invention can be exhibited.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A workpiece holding method for holding a workpiece having a bowl-shaped warp, the method comprising:
   a mounting step of mounting the workpiece on a holding unit having a holding surface for holding the workpiece, a suction hole opening to the holding surface, and a suction passage for making selective communication between the suction hole and suction means for producing a suction force, the workpiece being mounted on the holding surface of the holding unit, the mounting step including holding the workpiece by using a transfer mechanism and then mounting the workpiece on the holding surface by using the transfer mechanism;
   a liquid supplying step of supplying a liquid to the workpiece held on the holding surface so that the liquid flows into a gap defined between the holding surface and the workpiece to fill the gap, the liquid supplying step including supplying water as the liquid from the transfer mechanism to the workpiece held on the holding surface; and
   a suction step of bringing the suction hole into communication with the suction means and activating the suction means after the liquid supplying step, to suck the liquid and the workpiece and thereby hold the workpiece through suction of the liquid and the workpiece on the holding surface, after performing the liquid supplying step.

2. The workpiece holding method according to claim 1, further comprising a separating step of separating the workpiece from the holding unit by moving pushing mechanisms relative to the holding unit and against the workpiece to push the workpiece away from the holding unit.

3. The workpiece holding method according to claim 1, further comprising a cleaning step of spraying water on a front side or a back side of the workpiece to clean the front side or the back side of the workpiece.

4. The workpiece holding method according to claim 1, wherein the liquid is a non-gaseous liquid.

5. A workpiece processing method for processing a workpiece including a semiconductor wafer, the workpiece having a bowl-shaped warp, the method comprising:
   a mounting step of mounting the workpiece including the semiconductor wafer on a holding unit having a holding surface for holding the workpiece, a suction hole opening to the holding surface, and a suction passage for making selective communication between the suction hole and suction means for producing a suction force, the workpiece being mounted on the holding surface of the holding unit;
   a liquid supplying step of supplying a liquid to the workpiece held on the holding surface so that the liquid flows into a gap defined between the holding surface and the workpiece to fill the gap;
   a suction step of bringing the suction hole into communication with the suction means and activating the suction means after the liquid supplying step, to suck the liquid and the workpiece and thereby hold the workpiece through suction of the liquid and the workpiece on the holding surface, after performing the liquid supplying step;
   a processing step of processing the workpiece held on the holding surface after performing the suction step by annularly cutting the semiconductor wafer along a peripheral edge thereof using a cutting blade; and
   an unloading step of holding the workpiece by using a transfer mechanism after performing the processing step, and then unloading the workpiece from the holding surface by using the transfer mechanism.

6. The workpiece processing method according to claim 5, further comprising a separating step of separating the workpiece from the holding unit by moving pushing mechanisms relative to the holding unit and against the workpiece to push the workpiece away from the holding unit.

7. The workpiece processing method according to claim 5, further comprising a cleaning step of spraying water on a front side or a back side of the workpiece to clean the front side or the back side of the workpiece.

8. The workpiece holding method according to claim 5, wherein the liquid is a non-gaseous liquid.

* * * * *